US008871296B2

(12) United States Patent
Zhamu et al.

(10) Patent No.: US 8,871,296 B2
(45) Date of Patent: Oct. 28, 2014

(54) METHOD FOR PRODUCING CONDUCTING AND TRANSPARENT FILMS FROM COMBINED GRAPHENE AND CONDUCTIVE NANO FILAMENTS

(71) Applicants: Aruna Zhamu, Centerville, OH (US); Yi-jun Lin, Taoyuan (TW); Bor Z. Jang, Centerville, OH (US)

(72) Inventors: Aruna Zhamu, Centerville, OH (US); Yi-jun Lin, Taoyuan (TW); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 0 days.

(21) Appl. No.: 13/815,730

(22) Filed: Mar. 14, 2013

(65) Prior Publication Data

US 2014/0272172 A1 Sep. 18, 2014

(51) Int. Cl.

| | |
|---|---|
| ***C23C 16/26*** | (2006.01) |
| ***C23C 18/00*** | (2006.01) |
| ***B05D 5/12*** | (2006.01) |
| ***B05D 7/12*** | (2006.01) |
| ***B05D 1/02*** | (2006.01) |
| ***H01B 13/00*** | (2006.01) |

(52) U.S. Cl.

CPC .............. *H01B 13/0036* (2013.01); *B05D 1/02* (2013.01); *C23C 16/26* (2013.01); *B05D 5/12* (2013.01); *B05D 7/12* (2013.01); *Y10S 427/101* (2013.01)

USPC ......................... 427/122; 427/427.1; 427/901

(58) Field of Classification Search

USPC ............ 427/115, 122, 427.1–427.7, 600, 901

See application file for complete search history.

(56) References Cited

U.S. PATENT DOCUMENTS

| | | | | |
|---|---|---|---|---|
| 7,071,258 | B1 | 7/2006 | Jang et al. | |
| 7,449,133 | B2 * | 11/2008 | Gruner et al. | 252/511 |
| 2007/0284557 | A1 | 12/2007 | Gruner et al. | |
| 2008/0048996 | A1 | 2/2008 | Hu et al. | |
| 2008/0259262 | A1 * | 10/2008 | Jones et al. | 349/139 |
| 2009/0017211 | A1 | 1/2009 | Gruner et al. | |
| 2010/0000441 | A1 * | 1/2010 | Jang et al. | 106/31.13 |
| 2010/0176337 | A1 * | 7/2010 | Zhamu et al. | 252/182.1 |
| 2011/0014385 | A1 * | 1/2011 | Ahonen et al. | 427/421.1 |
| 2012/0015098 | A1 * | 1/2012 | Cheng et al. | 427/110 |
| 2013/0130037 | A1 * | 5/2013 | Bol et al. | 428/408 |

OTHER PUBLICATIONS

U.S. Appl. No. 11/509,424, filed Aug. 25, 2006, B. Z. Jang, et al.
U.S. Appl. No. 10/858,814, filed Jun. 3, 2004, B. Z. Jang, et al.
U.S. Appl. No. 11/784,606, filed Apr. 9, 2007, B. Z. Jang, et al.
U.S. Appl. No. 13/815,316, filed Feb. 21, 2013, Y. J. Lin, et al.

(Continued)

*Primary Examiner* — Brian K Talbot

(57) ABSTRACT

A method of producing a transparent and conductive film, comprising (a) forming aerosol droplets of a first dispersion comprising a first conducting nano filaments in a first liquid; (b) forming aerosol droplets of a second dispersion comprising a graphene material in a second liquid; (c) depositing the aerosol droplets of a first dispersion and the aerosol droplets of a second dispersion onto a supporting substrate; and (d) removing the first liquid and the second liquid from the droplets to form the film, which is composed of the first conducting nano filaments and the graphene material having a nano filament-to-graphene weight ratio of from 1/99 to 99/1, wherein the film exhibits an optical transparence no less than 80% and sheet resistance no higher than 300 ohm/square.

23 Claims, 9 Drawing Sheets

(56) References Cited

OTHER PUBLICATIONS

U.S. Appl. No. 13/815,317, filed Feb. 21, 2013, Y. J. Lin, et al.
L. Hu, D. S. Hecht, and G. Gruner, "Percolation in Transparent and Conducting Carbon Nanotube Networks," Nano Letters, 2004, 4, 2513-2517.
Z. Wu, et al. "Transparent, Conductive Carbon Nanotube Films," Science Aug. 27, 2004: vol. 305 No. 5688 pp. 1273-1276.
H. G. Park, et al., Transparent Conductive Single Wall Carbon Nanotube Network Films for Liquid Crystal Displays, ECS Solid State Lett. Oct. 2, 2012: R31-R33.
Jung-Yong Lee , Stephen T. Connor, Yi Cui, and Peter Peumans, "Solution-Processed Metal Nanowire Mesh Transparent Electrodes," Nano Letters, 2008, 8 (2), pp. 689-692.
S. De, et al., "Silver Nanowire Networks as Flexible, Transparent, Conducting Films: Extremely High DC to Optical Conductivity Ratios," ACS Nano, 2009, 3, 1767-1774.
T. G. Chen, et al., "Flexible Silver Nanowire Meshes for High-Efficiency Microtextured Organic-Silicon Hybrid Photovoltaics," ACS App. Mat.s & Interfaces, 2012, (12)6857-6864.
T. Kim, et al., Electrostatic Spray Depo. of Highly Trans. Silver Nanowire Electrode on Flexible Substrate, ACS Appl. Mater. Interf., Article ASAP; DOI: 10.1021/am3023543.
Y. Ahn, et al "Improved Thermal Oxidation Stability of Solution-Processable Silver Nanowire Trans. Electrode by RGO,"ACS Applied Materials & Interfaces, 2012, 4 (12), 6410-641.
G. Eda, et al., Large-Area Ultrathin Films of Reduced Graphene Oxide as a Transparent and Flexible Electronic Material. Nature Nanotechnology, 2008, 3, 270-274.
X. Wang, L. Zhi, and K. Mullen, Transparent, Conductive Graphene Electrodes for Dye-Sensitized Solar Cells. Nano Letters, 2008, 8, 323.
J. B. Wu, et al., "Organic Light-Emitting Diodes on Solution-Processed Graphene Transparent Electrodes," ACS Nano 2009, 4, 43-48.
S. De and J. N. Coleman, "Are There Fundamental Limitations on the Sheet Resistance and Transparence of Thin Graphene Films?" ACS Nano, May 25, 2010; 4(5), pp. 2713-2720.
K. S. Kim, et al. "Large-Scale Pattern Growth of Graphene Films for Stretchable Transparent Electrodes," Nature, 2009, 457, 706-710.
X. S. Li, et al. "Transfer of Large-Area Graphene Films for High-Performance Transparent Conductive Electrodes," Nano Letters, 2009, 9, 4359-4363.
A. Reina, et al. "Large Area, Few-Layer Graphene Films on Arbitrary Substrates by Chemical Vapor Deposition," Nano Letters, 2009, 9, 30-35.
Sukang Bae, et al., "Roll-to-roll production of 30-inch graphene films for transparent electrodes," Nature Nanotechnology, vol. 5, Aug. 2010, 574-578.
V. C. Tung, et al. "Low-Temp. Solution Processing of Graphene-Carbon Nanotube Hybrid Materials for High-Performance Transparent Cond." Nano Letters, 2009, 9,1949-1955.
I. N. Kholmanov, et al. "Improved Electrical Conductivity of Graphene Films Integrated with Metal Nanowires," Nano Letters, 2012, 12 (11), pp. 5679-5683.

* cited by examiner

METHOD FOR PRODUCING CONDUCTING AND TRANSPARENT FILMS FROM COMBINED GRAPHENE AND CONDUCTIVE NANO FILAMENTS

This application claims the benefits of the following patent applications: Yi-jun Lin, Aruna Zhamu, and Bor Z. Jang, "Highly Conducting and Transparent Film and Process for Producing Same," U.S. patent application Ser. No. 13/815,316 (Feb. 21, 2013). Yi-jun Lin, Aruna Zhamu, and Bor Z. Jang, "Process for Producing Highly Conducting and Transparent Films from Graphene Oxide-Metal Nanowire Hybrid Materials," U.S. patent application Ser. No. 13/815,317 (Feb. 21, 2013).

FIELD OF THE INVENTION

The present invention relates generally to the field of transparent conductive electrodes for solar cell, photo-detector, light-emitting diode, touch screen, and display device applications and, more particularly, to a graphene/nano filament-based hybrid film with a combination of exceptional optical transparency and high electrical conductivity (or low sheet resistance).

BACKGROUND OF THE INVENTION

The following references are related to the art of "transparent and conductive electrodes":

1. L. Hu, D. S. Hecht, and G. Gruner, "Percolation in Transparent and Conducting Carbon Nanotube Networks," *Nano Letters,* 2004, 4, 2513-2517.
2. Z. Wu, et al. "Transparent, Conductive Carbon Nanotube Films," Science 27 Aug. 2004: Vol. 305 no. 5688 pp. 1273-1276.
3. H. G. Park, et al., "Transparent Conductive Single Wall Carbon Nanotube Network Films for Liquid Crystal Displays, ECS Solid State Lett. 2 Oct. 2012: R31-R33.
4. Jung-Yong Lee, Stephen T. Connor, Yi Cui, and Peter Peumans, "Solution-Processed Metal Nanowire Mesh Transparent Electrodes," *Nano Letters,* 2008, 8 (2), pp 689-692.
5. S. De, et al., "Silver Nanowire Networks as Flexible, Transparent, Conducting Films: Extremely High DC to Optical Conductivity Ratios," *ACS Nano,* 2009, 3, 1767-1774.
6. Ting-Gang Chen, et al., "Flexible Silver Nanowire Meshes for High-Efficiency Microtextured Organic-Silicon Hybrid Photovoltaics," *ACS Applied Materials & Interfaces,* 2012, 4 (12), 6857-6864.
7. Taegeon Kim, et al., "Electrostatic Spray Deposition of Highly Transparent Silver Nanowire Electrode on Flexible Substrate, *ACS Appl. Mater. Interfaces*, Article ASAP; DOI: 10.1021/am3023543.
8. Y. Ahn, Y. Jeong, and Y. Lee, "Improved Thermal Oxidation Stability of Solution-Processable Silver Nanowire Transparent Electrode by Reduced Graphene Oxide," *ACS Applied Materials & Interfaces,* 2012, 4 (12), 6410-6414.
9. G. Gruner, L. Hu, and D. Hecht, "Graphene Film as Transparent and Electrically Conductive Material," US Patent Pub. No. 2007/0284557 (Dec. 13, 2007).
10. L. Hu, et al., "Touch Screen Devices Employing Nanostructure Network," US Patent Pub. No. 2008/0048996 (Feb. 28, 2008).
11. G. Gruner, et al.; "Graphene Film as Transparent and Electrically Conductive Material," US Patent Pub. No. 2009/0017211 (Jan. 15, 2009).
12. G. Eda, et al., "Large-Area Ultrathin Films of Reduced Graphene Oxide as a Transparent and Flexible Electronic Material. *Nature Nanotechnology,* 2008, 3, 270-274.
13. X. Wang, L. Zhi, and K. Mullen, "Transparent, Conductive Graphene Electrodes for Dye-Sensitized Solar Cells. *Nano Letters,* 2008, 8, 323.
14. J. B. Wu, et al., "Organic Light-Emitting Diodes on Solution-Processed Graphene Transparent Electrodes," *ACS Nano* 2009, 4, 43-48.
15. S. De and J. N. Coleman, "Are There Fundamental Limitations on the Sheet Resistance and Transparence of Thin Graphene Films?" *ACS Nano,* 2010 May 25; 4(5), pp. 2713-20.
16. K. S. Kim, et al. "Large-Scale Pattern Growth of Graphene Films for Stretchable Transparent Electrodes," *Nature,* 2009, 457, 706-710.
17. X. S. Li, et al. "Transfer of Large-Area Graphene Films for High-Performance Transparent Conductive Electrodes," *Nano Letters,* 2009, 9, 4359-4363.
18. A. Reina, et al. "Large Area, Few-Layer Graphene Films on Arbitrary Substrates by Chemical Vapor Deposition," *Nano Letters,* 2009, 9, 30-35.
19. Sukang Bae, et al., "Roll-to-roll production of 30-inch graphene films for transparent electrodes," *Nature Nanotechnology*, Vol. 5, August 2010, 574-578.
20. V. C. Tung, et al. "Low-Temperature Solution Processing of Graphene-Carbon Nanotube Hybrid Materials for High-Performance Transparent Conductors" *Nano Letters,* 2009, 9, 1949-1955.
21. I. N. Kholmanov, et al. "Improved Electrical Conductivity of Graphene Films Integrated with Metal Nanowires," Nano Letters, 2012, 12 (11), pp 5679-5683.

Optically transparent and electrically conductive electrodes are widely implemented in optoelectronic devices, such as photovoltaic (PV) or solar cells, light-emitting diodes, organic photo-detectors, and various display devices. For use in these applications, the electrode materials must exhibit both exceptionally high optical transmittance and low sheet resistance (or high electrical conductivity). More commonly used transparent and conductive oxides (TCO) for the electrodes in these devices include (a) indium tin oxide (ITO), which is used for organic solar cells and light-emitting diodes, and (b) Al-doped ZnO, which is used in amorphous solar cells. There are some alternatives to these TCO that are being considered, such as single-walled carbon nanotubes (CNT), graphene, and metal or metal nanowires (NW).

Discrete carbon nanotubes may be used to form a thin film of highly porous network (or mesh) of electron-conducting paths on an optically transparent substrate, such as glass or polymer (e.g., polyethylene terephthalate, PET or polycarbonate). The empty spaces between nanotubes allow for light transmission and the physical contacts between nanotubes form the required conducting paths [Refs. 1-3]. However, there are several major issues associated with the use of CNTs for making a transparent conductive electrode (TCE). For instance, a higher CNT content leads to a higher conductivity, but lower transmittance due to a lower amount of empty spaces. Further, the sheet resistances of CNT-based electrodes are dominated by the large CNT junction resistances due to the mixed carbon nanotube varieties, with ⅓ being metallic and ⅔ semiconducting. As a result, a typical sheet resistance of CNT networks on a plastic substrate is 200-1,000 ohms/square (Ω/□) at an optical transmittance of 80-90%. The relatively high sheet resistance, compared with the approximately 10-50 ohms/square of high-end ITO on a plastic substrate, is far from being adequate for the practical application of transparent CNT electrodes in current-based devices, such as organic light emitting diodes and solar cells. Furthermore, an optical transmittance of >85% (preferably >90%) is generally required for these devices. Even for voltage-driven devices, such as capacitive touch screens, electrowetting displays, and liquid crystal displays, a relatively low sheet resistance is highly desirable.

Metal nanowire mesh-based conductive and transparent films are also being considered as a potential replacement for ITO [Refs. 4-8]. However, metal nanowires also suffer from the same problems as CNTs. For instance, although individual metal nanowires (e.g. Ag nanowires) can have a high electrical conductivity, the contact resistance between metal nanowires can be significant. Additionally, although Ag nanowire films can show good optical and electrical performance, it has been difficult to make Ag nanowires into a free-standing thin film or a thin film of structural integrity coated on a substrate. In particular, Ag nanowire films that are deposited on a plastic substrate exhibit unsatisfactory flexibility and mechanical stability in that the nanowires can easily come off. Also, the surface smoothness is poor (surface roughness being too large).

Furthermore, all metal nanowires still have a long-term stability issue, making them unacceptable for practical use. When Ag nanowire films are exposed to air and water, Ag nanowires can be easily oxidized, leading to sharp increase in sheet resistance and haze of the films. Ahn, et al [Ref. 8] disclosed the deposition of a reduced graphene oxide (RGO) layer or multiple RGO layers to a pre-fabricated Ag nanowire layer. The intent was to protect the underlying Ag nanowire film, but this approach can introduce additional issues to the film, e.g. significantly reduced optical transmittance by carrying out multiple coating passes and increased sheet resistance (when the Ag nanowire film was coated with more than 3 passes).

Graphene is yet another potential alternative to ITO. An isolated plane of carbon atoms organized in a hexagonal lattice is commonly referred to as a single-layer graphene sheet. Few-layer graphene refers to a stack of up to 5-10 planes of hexagonal carbon atoms bonded along the thickness direction with van der Waals forces. The generally good optical transparency and good electrical conductivity of graphene have motivated researchers to investigate graphene films for transparent and conductive electrode (TCE) applications [Refs. 9-21].

For instance, Gruner et al [Refs. 9-11] suggested a transparent and conductive film comprising at least one network of “graphene flakes,” which are actually very thick graphite flakes. A suspension of graphite flakes in a solvent was deposited onto a transparent glass, allowing isolated graphite flakes to somehow overlap one another to form a mesh (e.g. FIG. 1 of Ref. 9 and FIG. 1 of Ref. 11). The empty spaces between graphite flakes permit the light to pass through. However, these films typically exhibit a sheet resistance as high as 50 kOhm/square (50,000Ω/□) at 50% transparency. The low transparency is a result of using thick graphite flakes, not graphene sheets. Gruner et al then attempted to improve the film performance by combining carbon nanotubes and graphite flakes to form an interpenetrating network of conductive pathways (e.g. FIG. 2 of Ref. 9 and FIG. 2 of Ref. 11). Unfortunately, the interpenetrating network of graphite flakes and carbon nanotubes lead to a film that is only 80% transparent at 2 kOhms/square or 65% transparent at 1 kOhms/square (e.g., paragraph [0026] in both Ref. 9 and Ref. 11). These values are absolutely unacceptable to the TCE industry.

In a graphene film made by metal-catalyzed chemical vapor deposition (CVD), each graphene plane loses 2.3-2.7% of the optical transmittance and, hence, a five-layer graphene sheet or a film with five single-layer graphene sheets stacked together along the thickness direction would likely have optical transmittance lower than 90%. Unfortunately, single-layer or few layer graphene films, albeit optically transparent, have a relatively high sheet resistance, typically $3\times10^{2}$-$10^{5}$ Ohms/square (or 0.3-100 kΩ/□). The sheet resistance is decreased when the number of graphene planes in a film increases. In other words, there is an inherent tradeoff between optical transparency and sheet resistance of graphene films: thicker films decrease not only the film sheet resistance but also the optical transparency.

A recent study [Ref. 19] has demonstrated that single-layer CVD graphene films prepared under stringent conditions can have sheet resistances as low as ~125Ω/□ with 97.4% optical transmittance. However, the sheet resistance is still lower than desirable for certain applications. The authors further used layer-by-layer stacking to fabricate a doped four-layer film that shows sheet resistance at values as low as ~30Ω/□ at ~90% transparency, which is comparable to those of certain ITO grades. However, the layer-by-layer procedure is not amenable to mass production of transparent conductive electrodes for practical uses. Doping also adds an extra level of complexity to an already highly complex and challenging process that requires a tight vacuum or atmosphere control. The CVD process and equipment are notoriously expensive. Strong and urgent needs exist for more reliable and lower-cost processes and/or TCE materials that exhibit outstanding performance (e.g. sheet resistance <100Ω/□, yet still maintaining a transparency no less than 90%).

Since both graphene and carbon nanotube (CNT) have carbon atoms as the primary element, it is appropriate to briefly discuss carbon-based materials at this juncture. Carbon is known to have five unique crystalline structures, including diamond, fullerene (0-D nano graphitic material), carbon nanotube or carbon nano-fiber (1-D nano graphitic material), graphene (2-D nano graphitic material), and graphite (3-D graphitic material). The carbon nanotube (CNT) refers to a tubular structure grown with a single wall or multi-wall. Carbon nanotubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Bulk natural flake graphite is a 3-D graphitic material with each particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

The constituent graphene planes of a graphite crystallite can be exfoliated and extracted (or isolated) to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness). When the platelet has up to 5-10 graphene planes, it is commonly referred to as "few-layer graphene" in the scientific community. Single-layer graphene and multi-layer graphene sheets are collectively called "nano graphene platelets" (NGPs). Graphene sheets/platelets (NGPs) are a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

It may be noted that NGPs include discrete sheets/platelets of single-layer and multi-layer pristine graphene, graphene oxide, or reduced graphene oxide with different oxygen contents. Pristine graphene has essentially 0% oxygen. Graphene oxide (GO) has 0.01%-46% by weight of oxygen and reduced graphene oxide (RGO) has 0.01%-2.0% by weight of oxygen. In other words, RGO is a type of GO having lower but non-zero oxygen content. Additionally, both GO and RGO contain a high population of edge- and surface-borne chemical groups, vacancies, oxidative traps, and other types of defects, and both GO and RGO contain oxygen and other non-carbon elements, e.g. hydrogen [Ref. 14; J. B. Wu, et al]. In contrast, the pristine graphene sheets are practically defect-free and contain no oxygen. Hence, GO and RGO are commonly considered in the scientific community as a class of 2-D nano material that is fundamentally different and distinct from pristine graphene.

It may be further noted that CVD graphene films, although relatively oxygen-free, tend to contain a significant amount of other non-carbon elements, such as hydrogen and nitrogen. The CVD graphene is polycrystalline and contains many defects, e.g., grain boundaries, line defects, vacancies, and other lattice defects, such as those many carbon atoms configured in pentagons, heptagons, or octagons, as opposed to the normal hexagon. These defects impede the flow of electrons and phonons. For these reasons, the CVD graphene is not considered as pristine graphene in the scientific community.

Pristine graphene can be produced by direct ultrasonication or liquid phase production, supercritical fluid exfoliation, direct solvent dissolution, alkali metal intercalation and water-induced explosion of natural graphite particles, or more expensive epitaxial growth. Pristine graphene is normally single-grain or single-crystalline, having no grain boundaries. Further, pristine graphene essentially does not contain oxygen or hydrogen. However, if so desired, the pristine graphene can be optionally doped with a chemical species, such as boron or nitrogen, to modify its electronic and optical behavior in a controlled manner.

A hybrid material containing both graphene oxide and CNT was formed into a thin film by Tung et al [Ref. 20], but the film does not exhibit a satisfactory balance of optical transparency and electrical conductivity. The highest performance film shows optical transmittance of 92%, but this is achieved at an unacceptable sheet resistance of 636Ω/□. The film with the lowest sheet resistance (240Ω/□ with un-doped RGO) shows 60% optical transmittance, which is not useful at all. The graphene component was prepared from heavily oxidized graphite, which was then intensely reduced with hydrazine.

Another hybrid material, containing non-pristine graphene (obtained by CVD) and silver nanowires, was formed into a film [Ref. 22]. Again, CVD-grown graphene is a polycrystalline material (not single-crystalline and not pristine) with many topological defects, such as non-hexagonal carbon atoms, vacancies, dislocations, and grain boundaries. Grain boundaries in graphene are line defects at the interfaces between two domains with different crystallographic orientations. Due to the processing conditions inherent to the CVD process, the CVD graphene also contains non-carbon elements (e.g. hydrogen) and non-hexagonal carbon atoms. All these characteristics (defects and impurities) can significantly impede the transport of electrons and phonons in CVD graphene films. Even with the help from silver nanowires, the best CVD graphene-AgNW hybrid film exhibits a sheet resistance value that is still far away from what can be theoretically achieved with graphene alone [Ref. 22]. Besides, CVD processes are slow and expensive.

As discussed above, the CNT mesh, metal nanowire mesh, CVD graphene film, GO film (including RGO film), CNT-graphite flake mesh, CNT-graphene oxide (GO) hybrid, and RGO-protected Ag nanowire mesh have been proposed to serve as a transparent and conductive electrode, but none has met the stringent combined requirements of transparency, conductivity, oxidation resistance or long-term stability, mechanical integrity and flexibility, surface quality, chemical purity, process ease, and low cost.

Thus, it is an object of the present invention to provide a method of producing a hybrid film containing both conductive nano filaments (e.g. metal nanowires or carbon nanotubes) and a graphene material that meets most or all of the aforementioned requirements.

It is another object of the present invention to provide an aerosol formation- or atomization-based method of producing a graphene/nano filament hybrid film that is a variable alternative to ITO. Surprisingly, this method inherently reduces contact resistance between metal nanowires (e.g. Ag or Cu nanowires) and that between a metal nanowire and a graphene material. This method also enables the coverage and protection of metal nanowires with a graphene film and the resulting hybrid film has good structural integrity, environmental stability, and surface smoothness.

SUMMARY OF THE INVENTION

An embodiment of the present invention is an aerosol-based method of producing an optically transparent and electrically conductive film. This method comprises: (a) forming aerosol droplets of a first dispersion comprising a first conducting nano filament (having a dimension less than 200 nm) in a first liquid; (b) forming aerosol droplets of a second dispersion or solution comprising a graphene material in a second liquid; (c) depositing the aerosol droplets of a first dispersion and the aerosol droplets of a second dispersion or solution onto a supporting substrate; and (d) removing the first liquid and the second liquid from the droplets to form the film, which is composed of the first conducting nano filaments and the graphene material having a nano filament-to-graphene weight ratio of from 1/99 to 99/1. The film exhibits an optical transparence no less than 80% and sheet resistance no higher than 300 ohm/square.

The first conducting nano filaments may be selected from metal nanowires, metal nano-rods, metal nanotubes, metal oxide filaments, metal-coated filaments (e.g. Ag-coated polymer fibers or Cu-coated carbon fibers)), conducting polymer fibers, carbon nano-fibers, carbon nanotubes, carbon nano-rods, or a combination thereof. The metal nanowires may be selected from nanowires of silver (Ag), gold (Au), copper (Cu), platinum (Pt), zinc (Zn), cadmium (Cd), cobalt (Co), molybdenum (Mo), aluminum (Al), an alloy thereof, or a combination thereof. The metal nanowires may be selected from nanowires of a transition metal or an alloy of a transition metal. Silver nanowires and copper nanowires are particularly preferred metal nanowires.

The graphene material may be selected from a single-layer or few-layer variant of pristine graphene, graphene oxide, reduced graphene oxide, hydrogenated graphene, nitrogenated graphene, doped graphene, chemically functionalized graphene, or a combination thereof, wherein the few-layer is defined as having less than 10 planes of hexagonal carbon atoms. The graphene material is preferably a single-layer or few-layer pristine graphene having 1 to 5 planes of hexagonal carbon atoms.

In a preferred method, step (a) of forming aerosol droplets of a first dispersion or step (b) of forming aerosol droplets of a second dispersion or solution is conducted through syringe-based atomization, compressed air-driven atomization, electrostatically-driven atomization, electro-spinning atomization, sonic wave-driven atomization, or a combination thereof. The two types of aerosol droplets may be produced separately and then deposited onto a supporting substrate sequentially (e.g. metal nanowires being deposited first, followed by deposition of graphene) or concurrently. Most desirably, step (c) contains depositing aerosol droplets of the first dispersion onto the supporting substrate to form an aggregate of the first nano filaments (e.g. nanowires) prior to depositing the aerosol droplets of a second dispersion or solution to from a graphene film that covers the nano filament aggregate.

In an embodiment, step (a) of forming aerosol droplets of the first dispersion and step (b) of forming aerosol droplets of a second dispersion or solution are combined into one step. This can be accomplished by dispersing the nano filaments and the graphene material in the same liquid medium to form a hybrid dispersion, which is then atomized to produce mixed aerosol droplets. Thus, step (a) and step (b) may contain dispersing the first conducting filaments and the graphene material in the first liquid, the second liquid, or a mixture of the first liquid and the second liquid to form a hybrid dispersion, which is aerosolized to form a mixture of aerosol droplets of the first dispersion and aerosol droplets of the second dispersion.

Preferably, the method involves a roll-to-roll process that is fully automated. In an embodiment, step (c) may contain intermittently or continuously feeding the supporting substrate from a feeder roller into a deposition zone where the aerosol droplets of a first dispersion and aerosol droplets of a second dispersion or solution are deposited onto the supporting substrate to form a transparent conductive film-coated substrate, and the method further contains a step of collecting the coated substrate on a collector roller.

We have further surprisingly observed that it is highly advantageous to propel aerosol droplets of the first dispersion and/or aerosol droplets of the second dispersion or solution to deposit onto the supporting substrate at an impingement speed of at least 1.0 cm/s, preferably at least 10 cm/s. This high impingement speed was found to impart a higher conductivity or lower sheet resistance to the resulting transparent and conductive film.

The presently invented method leads to the formation of an optically transparent and electrically conductive film that exhibits an optical transparence no less than 85% and sheet resistance no higher than 100 ohm/square and, in many cases, an optical transparence no less than 85% and sheet resistance no higher than 50 ohm/square. It was often found that the film exhibits an optical transparence no less than 90% and sheet resistance no higher than 200 ohm/square and, in some cases, an optical transparence no less than 90% and sheet resistance no higher than 100 ohm/square. With a good atomization procedure, coupled with a sufficiently high aerosol impingement speed, the film exhibits an optical transparence no less than 92% and sheet resistance no higher than 100 ohm/square. Preferably, the supporting substrate is optically transparent.

DESCRIPTION OF THE PREFERRED EMBODIMENTS

Figure 1A:
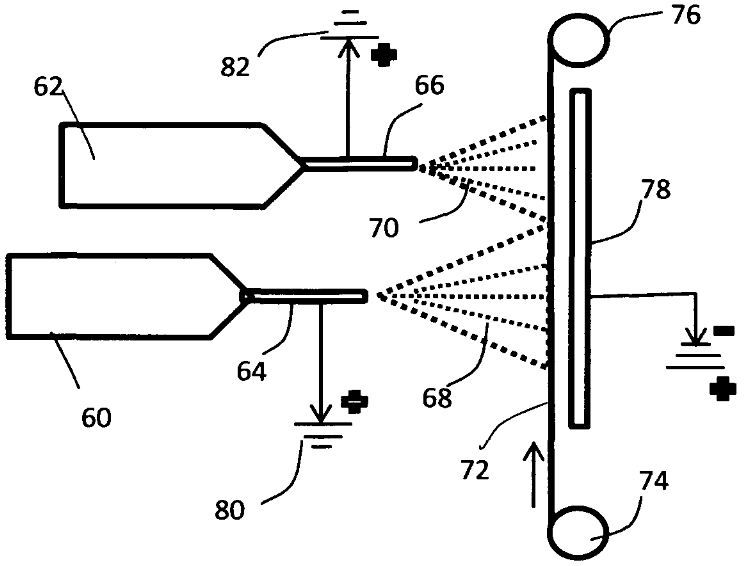
FIG. 1 (*a*) Schematic of an electro-spinning-based aerosol droplet formation and deposition system; (*b*) schematic of an ultrasonic spray coating based system.

A preferred embodiment of the present invention is a method of producing an optically transparent and electrically conductive film composed of a mixture or hybrid of conductive nano filaments (e.g. metal nanowires) and a graphene material. The nano filament-to-graphene weight ratio in this mixture is from 1/99 to 99/1. The film exhibits an optical transparence no less than 80% and sheet resistance no higher than 300 ohm/square. The film is typically thinner than 1 μm, more often thinner than 100 nm, even more often and preferably thinner than 10 nm, most often thinner than 1 nm, and can be as thin as 0.34 nm.

This method comprises: (a) forming aerosol droplets of a first dispersion comprising a first conducting nano filament (having a dimension less than 200 nm) in a first liquid; (b) forming aerosol droplets of a second dispersion or solution comprising a graphene material in a second liquid; (c) depositing both types of aerosol droplets onto a supporting substrate; and (d) during or after deposition, removing the first liquid and the second liquid from the droplets to form the film. The resulting product is a hybrid film composed of the first conducting nano filaments and the graphene material having a nano filament-to-graphene weight ratio of from 1/99 to 99/1.

The first conducting nano filaments may have a dimension (e.g. diameter or thickness) less than 200 nm, preferably less than 100 nm, further preferably less than 50 nm, and most preferably less than 20 nm. A wide array of conductive nano filaments may be incorporated in the hybrid film, including, as examples, metal nanowires, metal nano-rods, metal nanotubes, metal oxide filaments, metal-coated filaments (e.g. Ag-coated polymer fibers or Cu-coated carbon fibers)), conducting polymer fibers, carbon nano-fibers, carbon nanotubes, carbon nano-rods, or a combination thereof. The metal nanowires may be selected from nanowires of silver (Ag), gold (Au), copper (Cu), platinum (Pt), zinc (Zn), cadmium (Cd), cobalt (Co), molybdenum (Mo), aluminum (Al), an alloy thereof, or a combination thereof. The metal nanowires may be selected from nanowires of a transition metal or an alloy of a transition metal. Silver nanowires and copper nanowires are particularly preferred metal nanowires for use in the presently invented hybrid film.

The graphene material may be selected from a single-layer or few-layer variant of pristine graphene, graphene oxide, reduced graphene oxide, hydrogenated graphene, nitrogenated graphene, doped graphene, chemically functionalized graphene, or a combination thereof, wherein the few-layer is defined as having less than 10 planes of hexagonal carbon atoms. The graphene material is preferably a single-layer or few-layer pristine graphene having 1 to 5 planes of hexagonal carbon atoms.

The method begins with the preparation of nano filament dispersion and graphene dispersion (or solution), separately or in combination. Nano filaments, such as silver nanowires (AgNM) and copper nanowires (CuNW), can be readily dispersed in a liquid medium (solvent or water) with or without the assistance of a dispersing agent (e.g. surfactant). The resulting suspension or dispersion is herein referred to as the first dispersion comprising first conducting nano filaments.

Various types of graphene materials can be readily dispersed or dissolved in a solvent, e.g. pristine graphene dissolved in NMP and graphene oxide in water. Pristine graphene (with little or no non-carbon elements, having never been exposed to oxidation or intercalation treatment) can also be dispersed in water, if in the presence of a suitable surfactant. In all cases, the resulting product is herein referred to as the second dispersion or solution comprising a graphene material in a second liquid.

Alternatively, conductive nano filaments and a graphene material may be dispersed in the same liquid fluid to form a mixture dispersion or hybrid suspension. The first dispersion, second dispersion, and mixture dispersion can then be atomized or aerosolized to form "aerosol droplets of first dispersion" (or, simply, "first aerosol droplets"), "aerosol droplets of second dispersion or solution" (or, simply, "second aerosol droplets"), and hybrid aerosol droplets, respectively.

In a preferred method, the step of forming aerosol droplets of any type is conducted through syringe-based atomization, compressed air-driven atomization, electrostatically-driven atomization, electro-spinning atomization, sonic wave-driven atomization (e.g. using an ultrasonic spray nozzle), or a combination thereof.

Figure 1B:
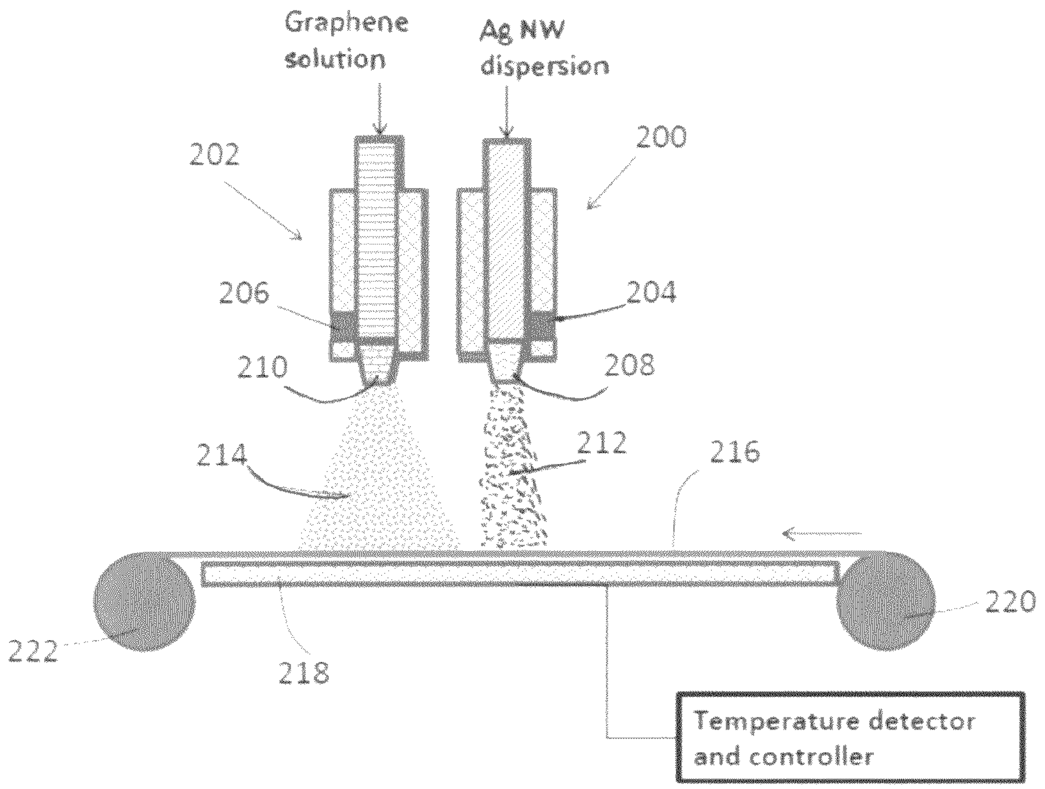

FIG. 1(*a*) provides a syringe-based atomization and spray system as an example, wherein there are two syringes 60, 62 each having a dispensing needle 64, 66 electrically connected to a high voltage source 80, 82. The two syringes 60, 62 contain the first dispersion (conductive nano filaments and an optional filler or modifier in a first liquid medium) and the second dispersion (graphene in a second liquid), respectively. When the high voltage source 80 is turned on, for instance, the first dispersion is aerosolized through a nozzle of the dispensing needle 64, forming aerosol droplets 68 of the first dispersion. The aerosol droplets 68 are propelled toward a supporting substrate 72 under the influence of a strong electric field established between the dispensing needle 64 and a counter-electrode 78. The aerosol droplets impinge upon the surface of the supporting substrate and the nano filaments get deposited thereon with the first liquid medium being removed during or after droplet impingement, forming aggregates of conductive nano filaments. The supporting substrate 72 (e.g. a polyethylene terephthalate or PET film) may be fed intermittently or continuously from a feeder roller 74 into a deposition zone nearby the counter-electrode 78 and then wound up on a collector roller 76. Such a configuration constitutes a roll-to-roll operation, which is highly scalable.

In a similar manner, the second dispersion may be aerosolized or atomized through the dispensing nozzle 66 to form aerosol droplets 70 of the second dispersion (graphene in a second liquid medium), which are driven to travel toward the supporting substrate. The position and speed of the aerosol droplets 70 may be adjusted to ensure that the graphene material is deposited onto the supporting substrate and adequately cover the nano filament aggregates deposited thereon slightly earlier.

In an embodiment, if the syringe 60 contains a conductive polymer (e.g. polyaniline) as a precursor to conductive nano filaments, then the aerosol droplets 68 of the first dispersion contain electro-spun polymer nano-fibers. This aerosol formation process is essentially an electro-spinning-based atomization. As another embodiment wherein no polymer electro-spinning is involved, this aerosol formation procedure is essentially an electro-statically driven atomization. It may be noted that electro-spinning or electrostatically driven atomization does not have to make use of a syringe-type dispersion-holding device. As an example, a syringe-type device can act as a dispenser to supply a controlled flow rate of dispersion, which is then atomized via compressed air in an atomization nozzle.

FIG. 1(*b*) provides an ultrasonic spray-based coating system as an example, wherein there are two ultrasonic spray heads 200, 202 each having a dispensing nozzle 208, 210 driven by piezoelectric transducer 204, 206. The spray heads 200, 202 contain the first dispersion (conductive nano filaments in a first liquid medium) and the second dispersion (graphene in a second liquid), respectively. When the transducer 204 is turned on, for instance, the first dispersion is aerosolized through the nozzle 208, forming aerosol droplets 212 of the first dispersion. The aerosol droplets 212 are propelled toward a supporting substrate 216. The aerosol droplets impinge upon the surface of the supporting substrate and the nano filaments get deposited thereon with the first liquid medium being removed during or after droplet impingement, forming aggregates of conductive nano filaments. The supporting substrate 216 (e.g. a polyethylene terephthalate or PET film) may be fed intermittently or continuously from a feeder roller 220 into a deposition zone nearby a heating element 218 and then wound up on a collector roller 222. Such a configuration constitutes a roll-to-roll operation, which is highly scalable.

In a similar manner, when the transducer 206 is activated, the second dispersion may be aerosolized or atomized through the dispensing nozzle 210 to form aerosol droplets 214 of the second dispersion (graphene in a second liquid medium), which are driven to travel toward the supporting substrate 216. The position and speed of the aerosol droplets 214 may be adjusted to ensure that the graphene material is deposited onto the supporting substrate and adequately cover the nano filament aggregates deposited thereon slightly earlier.

Graphene normally refers to a sheet of carbon atoms that are arranged in a hexagonal lattice and the sheet is one carbon atom thick. This isolated, individual plane of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness). When the platelet has up to 5-10 graphene planes, it is commonly referred to as "few-layer graphene" in the scientific community. Single-layer graphene and multi-layer graphene sheets are collectively called "nano graphene platelets" (NGPs). Graphene sheets/platelets or NGPs are a new class of carbon nano material (a 2-D nano carbon) that is distinct from the 0-D fullerene, the 1-D CNT, and the 3-D graphite.

In the instant application, NGPs or graphene materials can include discrete sheets or platelets of single-layer and multi-layer pristine graphene, graphene oxide, reduced graphene oxide with different oxygen contents, hydrogenated graphene, nitrogenated graphene, doped graphene, or chemically functionalized graphene. Pristine graphene has essentially 0% oxygen and 0% hydrogen. Graphene oxide (GO) has 0.01%-46% by weight of oxygen and reduced graphene oxide (RGO) has 0.01%-2.0% by weight of oxygen. In other words, RGO is a type of GO having lower but non-zero oxygen content. Additionally, both GO and RGO contain a high population of edge- and surface-borne chemical groups, vacancies, oxidative traps, and other types of defects, and both GO and RGO contain oxygen and other non-carbon elements, e.g. hydrogen. In contrast, the pristine graphene sheets are practically defect-free on the graphene plane and contain no oxygen. Hence, GO and RGO are commonly considered in the scientific community as a class of 2-D nano material that is fundamentally different and distinct from pristine graphene.

Figure 2A:
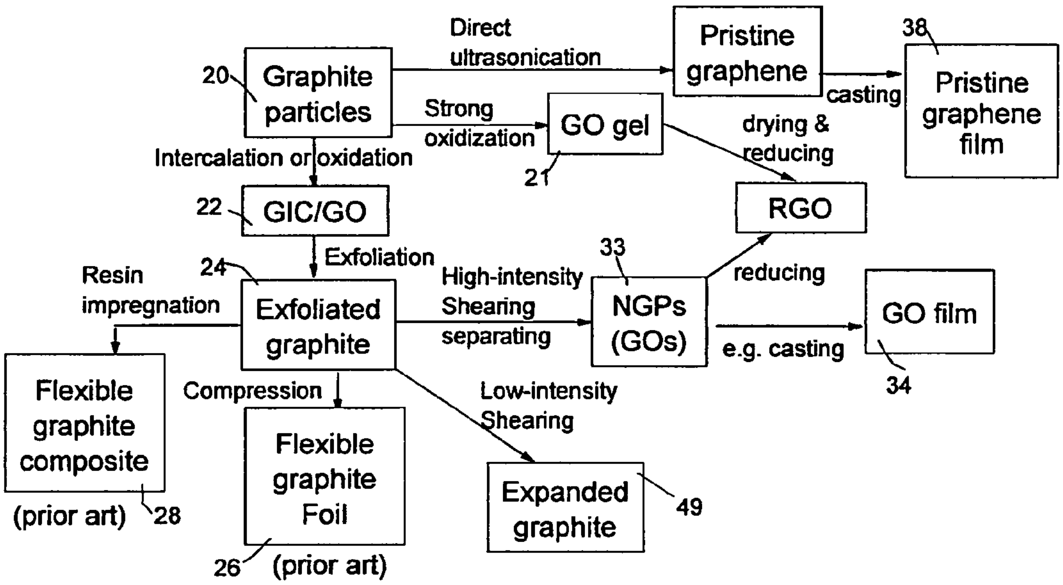
FIG. 2 (*a*) A flow chart illustrating various prior art processes for producing nano graphene platelets (graphene oxide, reduced graphene oxide, and pristine graphene) and exfoliated graphite products (flexible graphite foils and flexible graphite composites); (*b*) Schematic drawing illustrating the processes for producing a thick (non-transparent) film or membrane of simply aggregated graphite or NGP flakes/platelets; all processes begin with intercalation and/or oxidation treatment of graphitic materials (e.g. natural graphite particles).
Figure 2B:
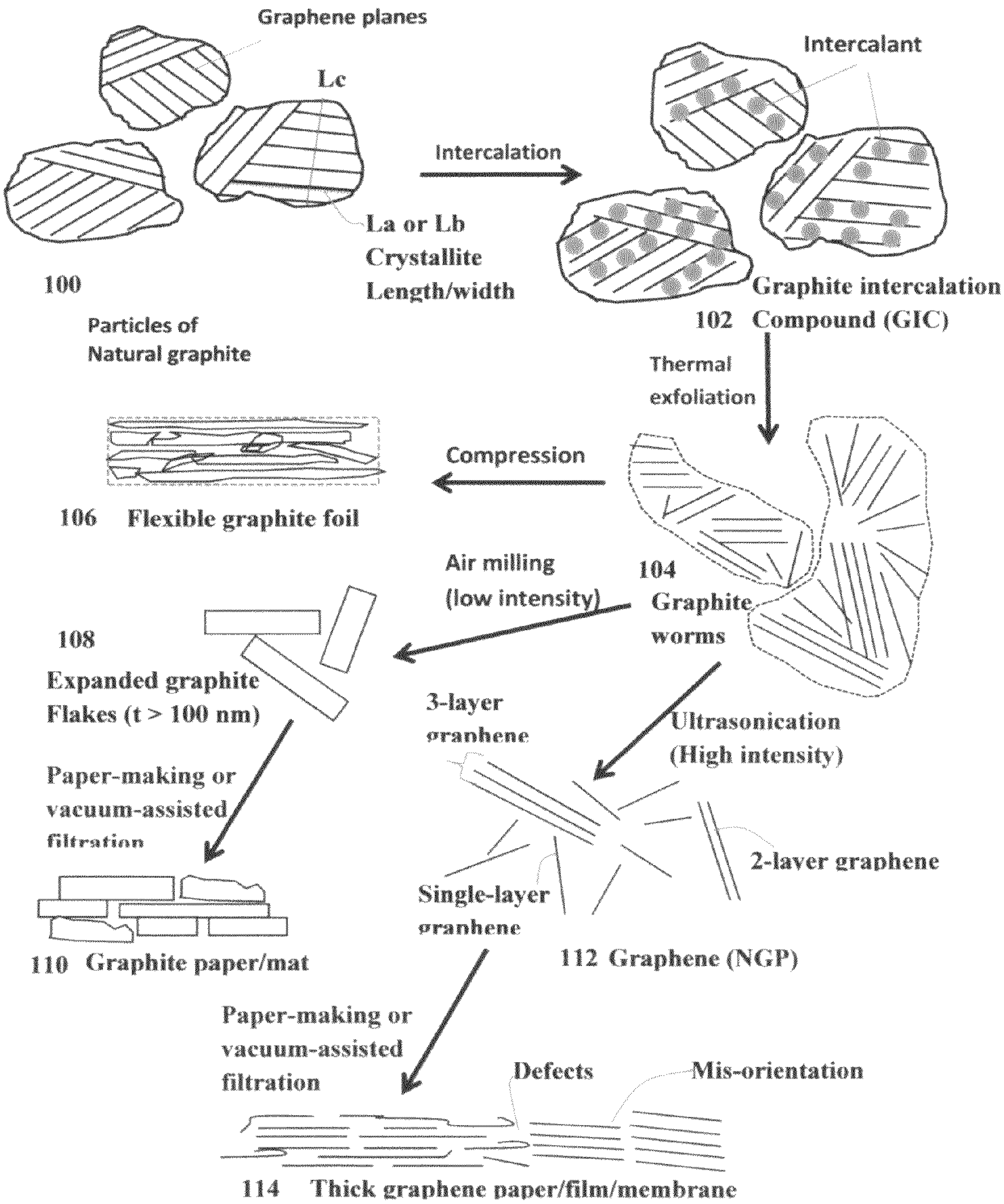
Figure 3A:
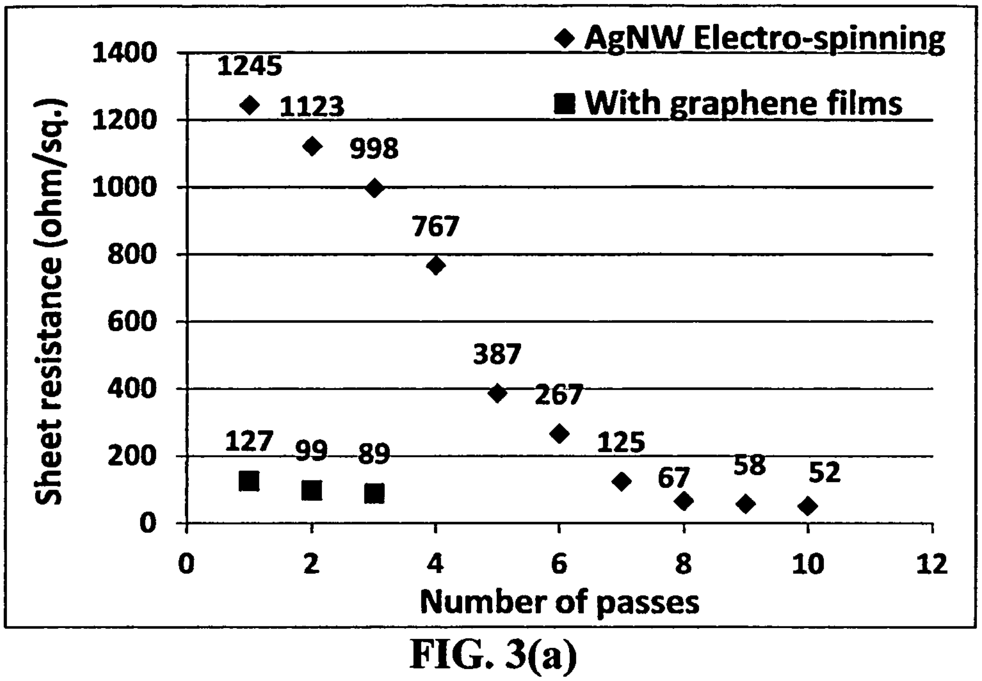
FIG. 3 (*a*) Sheet resistance of AgNW films; (*b*) optical transmittance (at 550 nm wavelength) of AgNW films; and (*c*) sheet resistance of graphene films prepared with electro-spinning type atomization and deposition procedures, all plotted with the number of electro-spinning passes; (*d*) comparison between electro-spinning-based aerosol films and spin-coating-based films.
Figure 3B:
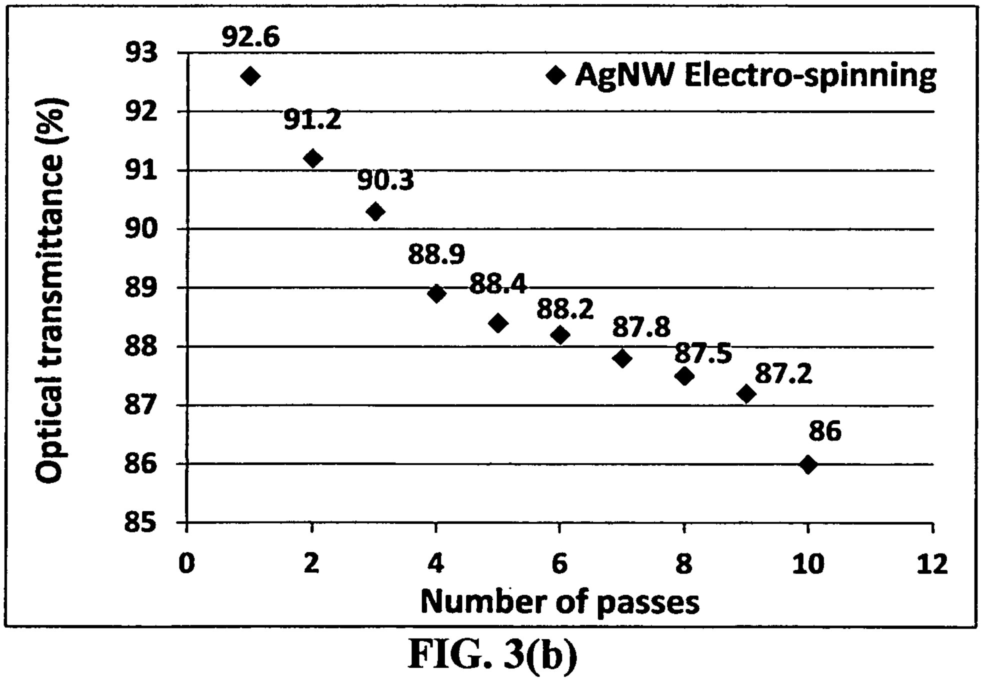
Figure 3C:
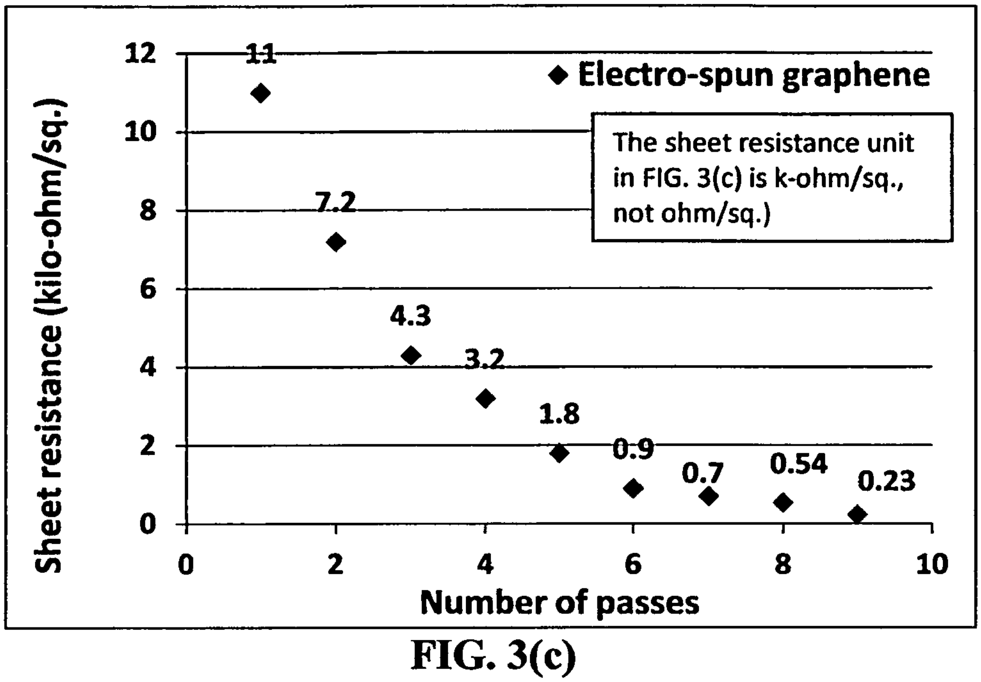
Figure 3D:
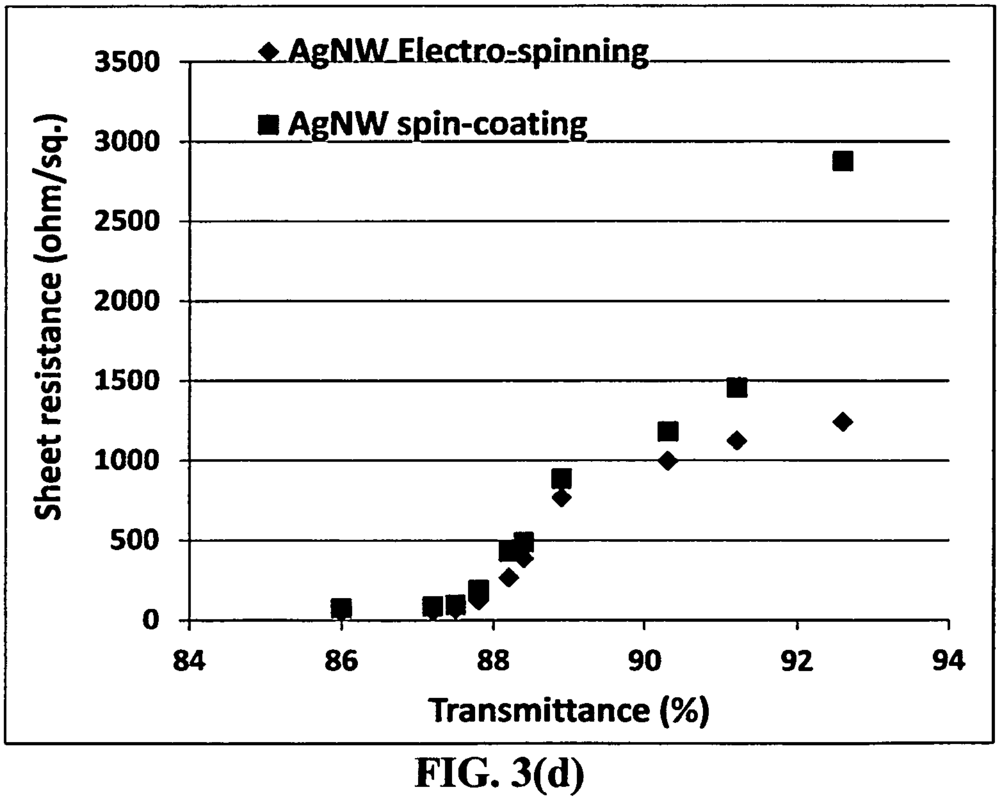

Graphene materials are commonly obtained by intercalating natural graphite particles with a strong acid and/or oxidizing agent to obtain a graphite intercalation compound (GIC) or graphite oxide (GO), as illustrated in FIG. 2(*a*) (process flow chart) and FIG. 2(*b*) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the crystallographic c-axis direction. The GIC or GO is most often produced by immersing natural graphite powder (20 in FIG. 2(*a*) and 100 in FIG. 2(*b*)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. Strong oxidation of graphite particles can result in the formation of a gel-like state called "GO gel" 21. The GIC 22 is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the graphite oxide suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid expansion by a factor of 30-300 to form "graphite worms" (24 or 104), which are each a collection of exfoliated, but largely un-separated graphite flakes that remain interconnected.

In Route 1A, these graphite worms (exfoliated graphite or "networks of interconnected/non-separated graphite flakes") can be re-compressed to obtain flexible graphite sheets or foils (26 or 106) that typically have a thickness in the range of 0.1 mm (100 μm)-0.5 mm (500 μm). Alternatively, one may choose to use a low-intensity air mill or shearing machine to simply break up the graphite worms for the purpose of producing the so-called "expanded graphite flakes" (49 or 108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils are completely opaque and cannot be used as a transparent electrode.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is typically less than 20 nm. The NGPs (still containing oxygen) may be dispersed in a liquid medium and cast into a GO thin film 34.

Route 2 entails ultrasonicating the graphite oxide suspension for the purpose of separating/isolating individual graphene oxide sheets from graphite oxide particles. This is based on the notion that the inter-graphene plane separation has been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.01%-10% by weight, more typically 0.01%-5% by weight, and most typically 0.01%-2.0% by weight of oxygen with heavy chemical reduction using a reducing agent like hydrazine. In the scientific community, the chemically processed graphene-based transparent and conductive electrode normally refers to the RGO produced in this manner (as opposed to CVD deposited).

It is important to further emphasize the fact that, in the typical prior art processes, ultrasonification is used after intercalation and oxidation of graphite (i.e., after first expansion) and most typically after thermal shock exposure of the resulting GIC or GO (i.e., after second expansion or exfoliation) to aid in breaking up those graphite worms. There are already much larger spacings between flakes after intercalation and/ or after exfoliation (hence, making it possible to easily separate flakes by ultrasonic waves). This ultrasonication was not perceived to be capable of separating those un-intercalated/un-oxidized layers where the inter-graphene spacing remains <0.34 nm and the van der Waals forces remain strong.

The applicant's research group was the very first in the world to surprisingly observe that, under proper conditions (e.g., with an ultrasonic frequency and intensity and under the assistance of a certain type of surfactant), ultrasonication can be used to produce ultra-thin graphene directly from graphite, without having to go through chemical intercalation or oxidation. This invention was reported in a patent application [A. Zhamu, et al., "Method of Producing Exfoliated Graphite, Flexible Graphite, and Nano Graphene Plates," U.S. patent Ser. No. 11/800,728 (May 8, 2007); now U.S. Pat. No. 7,824, 651 (Nov. 2, 2010)]. This "direct ultrasonication" process is capable of producing both single-layer and few-layer pristine graphene sheets. This innovative process involves simply dispersing pristine graphite powder particles 20 in a liquid medium (e.g., water, alcohol, or acetone) containing a dispersing agent or surfactant to obtain a suspension. The suspension is then subjected to an ultrasonication treatment, typically at a temperature between 0° C. and 100° C. for 10-120 minutes, resulting in ultra-thin pristine graphene sheets suspended in a liquid medium. The resulting suspension can be cast to form a pristine graphene film 38. No chemical intercalation or oxidation is required. The graphite material has never been exposed to any obnoxious chemical. This process combines expansion, exfoliation, and separation into one step. Hence, this simple yet elegant method obviates the need to expose graphite to a high-temperature, or chemical oxidizing environment. Upon drying, the resulting NGPs are essentially pristine graphene, containing no oxygen and no surface defects. These pristine graphene sheets, single-layer or multi-layer, are all highly conductive both electrically and thermally.

A chemical reducing agent (e.g. hydrazine or sodium boron hydride) may be used to reduce the GO to "reduced graphene oxide" (RGO) sheets. Upon removal of the liquid, the resulting product is RGO powder. Alternatively, the GO solution can be just boiled for an extended period of time (e.g. >1 hour) to precipitate out the partially reduced GO. By removing the liquid component one obtains the partially reduced GO, which can be further heat-treated to produce fully reduced RGO. The RGO powder produced by either approach can be re-dispersed in a solvent with the assistance of a surfactant or dispersing agent to form a suspension, which can be cast or spin-coated to form RGO films. Initially, these commonly accepted casting or spin-coating procedures were what we used to prepare thin RGO films or RGO-protected metal nanowire films. Pristine graphene dispersed or dissolved in a solvent can also be formed into a thin film via casting or spin-coating. However, the sheet resistance and optical transparency of the films produced in this manner using casting or spin-coating were not satisfactory.

We then decided to undertake a different approach. Instead of using spin-coating or casting, we produce aerosol droplets, and then propel and deposit aerosol droplets onto a transparent substrate, enabling conductive nano filaments to impinge upon each other while they are being deposited on the substrate. The method also allows graphene sheets to impinge upon and protect the previously or concurrently deposited aggregates of nano filaments. Such a strategy has surprisingly resulted in lower sheet resistance at a given level of optical transparency. This strategy also leads to thin films that are smoother in surface morphology and exhibit improved structural integrity and better adhesion to the supporting substrate (e.g. PET film). The latter is reflected as a larger number of bending deformations of the coated film without showing a sign of delamination.

There are many processes, with or without a template, that can be used to produce metal nanowires, and these are well known in the art. A widely used approach to fabricate metal nanowires is based on the use of various templates, which include negative, positive, and surface step templates. Negative template methods use prefabricated cylindrical nanopores in a solid material as templates. By depositing metals into the nano-pores, nanowires with a diameter predetermined by the diameter of the nano-pores are fabricated.

The positive template method uses wire-like nanostructures, such as DNA and carbon nanotubes, as templates and nanowires are formed on the outer surface of the templates. Unlike negative templates, the diameters of the nanowires are not restricted by the template sizes and can be controlled by adjusting the amount of materials deposited on the templates. By removing the templates after deposition, wire-like and tube-like structures can be formed.

Atomic-scale step edges on a crystal surface can be used as templates to grow nanowires. The method takes advantage of the fact that deposition of many materials on a surface often starts preferentially at defect sites, such as surface step-edges. For this reason, the method is sometimes called "step edge decoration." As examples, several research groups prepared metal nanowires on vicinal single crystal surfaces using the physical vapor deposition (PVD) method. Others fabricated metal nanowires of 1-2 atomic layer thick with a controlled "width" and wire spacing.

Many types of metal nanowires can be used for practicing the present invention. Examples include silver (Ag), gold (Au), copper (Cu), platinum (Pt), zinc (Zn), cadmium (Cd), cobalt (Co), molybdenum (Mo), aluminum (Al), and their alloys. However, Ag and Cu nanowires are the most preferred choices. Various graphene-, metal nanowire-, graphene/metal nanowire-, and other graphene/nano filament hybrid films may be deposited from the suspension or ink using a variety of conventional deposition methods, including spray painting, drop casting, spin coating, vacuum-assisted filtration, and dip coating. However, the presently invented aerosol droplet-based approaches were found to be the most effective and reliable.

In a conventional spray painting process, the solution or suspension can be spray painted onto a heated or non-heated substrate. The substrate may be rinsed during the spraying process to remove the solubilization agent, or surfactant. The spraying solution or suspension may be of any concentration. The substrate surface may be functionalized to aid in adhesion of the deposited species (metal nanowires, CNTs, and/or GO). The spraying rate and the number of spraying passes may be varied to obtain different amounts of deposited species.

In a drop casting process, a drop of the solution/suspension/ink can be placed onto a substrate for a period of time. The substrate may be functionalized to enhance adhesion of deposited species. The substrate with graphene may be rinsed by appropriate solvents.

Alternatively, the suspension can be spin-coated along with an appropriate solvent to remove the surfactant simultaneously.

In dip coating, the supporting substrate can be dipped into the suspension for a period of time. This may form a film of RGO or RGO/nanowire hybrids.

In a printing process, the film may be transferred from one substrate to another by means of a stamp. The stamp may be made from Polydimethyl-siloxane (PDMS). The transfer can be aided by gentle heating (up to 100° C.) and pressure.

In a vacuum filtration process, the suspension/ink can be filtered through a porous membrane under the assistance of a vacuum pump. A film of RGO or RGO-nanowire hybrid is deposited on top of the filtering membrane. The film can be washed while on the filter with a liquid medium to remove surfactant, functionalization agents, or unwanted impurities.

Our experimental data have demonstrated that aerosol-based processes result in the best results as compared to these processes for making a hybrid film comprising a conductive nano filament and a hybrid material.

The following examples serve to provide the best modes of practice for the present invention and should not be construed as limiting the scope of the invention:

Example 1

Direct Ultrasonication Production of Pristine Graphene from Natural Graphite in a Low Surface Tension Medium As an example, five grams of natural graphite, ground to approximately 20 μm or less in sizes, were dispersed in 1,000 mL of n-Heptane to form a graphite suspension. An ultrasonicator tip was then immersed in the suspension, which was maintained at a temperature of 0-5° C. during subsequent ultrasonication. An ultrasonic energy level of 200 W (Branson S450 Ultrasonicator) was used for exfoliation and separation of graphene planes from dispersed graphite particles for a period of 1.5 hours. The average thickness of the resulting pristine graphene sheets was 1.1 nm, having mostly single-layer graphene and some few-layer graphene.

Example 2

Preparation of Pristine Graphene from Natural Graphite in Water-Surfactant Medium Using Direct Ultrasonication As another example, five grams of graphite flakes, ground to approximately 20 μm or less in sizes, were dispersed in 1,000 mL of deionized water (containing 0.15% by weight of a dispersing agent, Zonyl® FSO from DuPont) to obtain a suspension. An ultrasonic energy level of 175 W (Branson S450 Ultrasonicator) was used for exfoliation, separation, and size reduction for a period of 1.5 hour. This procedure was repeated several times, each time with five grams of starting graphite powder, to produce a sufficient quantity of pristine graphene for thin film deposition.

Example 3

Preparation of Pristine Graphene Using Supercritical Fluids

A natural graphite sample (approximately 5 grams) was placed in a 100 milliliter high-pressure vessel. The vessel was equipped with security clamps and rings that enable isolation of the vessel interior from the atmosphere. The vessel was in fluid communication with high-pressure carbon dioxide by way of piping means and limited by valves. A heating jacket was disposed around the vessel to achieve and maintain the critical temperature of carbon dioxide.

High-pressure carbon dioxide was introduced into the vessel and maintained at approximately 1,100 psig (7.58 MPa). Subsequently, the vessel was heated to about 70° C. at which the supercritical conditions of carbon dioxide were achieved and maintained for about 3 hours, allowing carbon dioxide to diffuse into inter-graphene spaces. Then, the vessel was immediately depressurized "catastrophically' at a rate of about 3 milliliters per second. This was accomplished by opening a connected blow-off valve of the vessel. As a result, delaminated or exfoliated graphene layers were formed. This sample was found to contain pristine NGPs with an average thickness just under 10 nm.

Approximately two-thirds of the sample were subjected to another cycle of supercritical $CO_2$ intercalation and de-pressurization treatments (i.e., the above procedures were repeated), yielding much thinner NGPs with an average thickness of 2.1 nm. The specific surface area, as measured by the BET method, was approximately 430 $m^2/g$. TEM and AFM examinations indicated that there were many single-layer graphene sheets in this sample.

Another sample was prepared under essentially identical supercritical $CO_2$ conditions, with the exception that a small amount of surfactant (approximately 0.05 grams of Zonyl® FSO) was mixed with 5 grams of natural graphite before the mixture was sealed in the pressure vessel. The resulting NGPs have a surprisingly low average thickness, 3.1 nm. After the pressurization and de-pressurization procedures were repeated for another cycle, the resulting NGPs have an average thickness less than 1 nm, indicating that a majority of the NGPs are single-layer or double-layer sheets. The specific surface area of this sample after a repeated cycle was approximately 900 $m^2/g$. It is clear that the presence of a surfactant or dispersing agent promotes separation of graphene layers, perhaps by preventing the reformation of van der Waals forces between graphene sheets once separated.

Example 4

Thermal Exfoliation and Separation of Graphite Oxide

Graphite oxide was prepared by oxidation of graphite flakes with sulfuric acid, nitrate, and permanganate according to the method of Hummers [U.S. Pat. No. 2,798,878, Jul. 9, 1957]. Upon completion of the reaction, the mixture was poured into deionized water and filtered. The graphite oxide was repeatedly washed in a 5% solution of HCl to remove most of the sulphate ions. The sample was then washed repeatedly with deionized water until the pH of the filtrate was neutral. The slurry was spray-dried and stored in a vacuum oven at 60° C. for 24 hours. The interlayer spacing of the resulting laminar graphite oxide was determined by the Debye-Scherrer X-ray technique to be approximately 0.73 nm (7.3 Å).

Dried graphite oxide powder was then placed in a tube furnace maintained at a temperature of 1,050° C. for 60 minutes. The resulting exfoliated graphite was subjected to low-power ultrasonication (60 watts) for 10 minutes to break up the graphite worms and separate graphene oxide layers. Several batches of graphite oxide (GO) platelets were produced under identical conditions to obtain approximately 2.4 Kg of oxidized NGPs or GO platelets. A similar amount of GO platelets was obtained and then subjected to chemical reduction by hydrazine at 140° C. for 24 hours. The GO-to-hydrazine molecular ratio was from 1/5 to 5/1. The resulting products are RGOs with various controlled oxygen contents.

Example 5

Preparation of Thin Films from Silver Nanowires (AgNW), RGO, and AgNW/RGO Hybrid Materials Using Aerosol Droplet-Based Methods and Conventional Spin-Coating Method Silver nanowires were purchased from Seashell Technologies (La Jolla, Calif., USA) as suspension in isopropyl alcohol with concentrations of 25 mg/ml. A small volume of dispersion was diluted down to approximately 1 mg/ml with isopropyl alcohol. This was subjected to half-an-hour sonication in a sonic bath. Then, this suspension was subjected to aerosol formation using an electro-spinning device and the resulting aerosol droplets were propelled to impact the surface of a poly(ethylene terephthalate) (PET) substrate at various speeds. The typical droplet impingement speeds are from 1 mm/sec to 100 cm/sec. In a first set of experiments, the graphene materials used were pristine graphene and reduced graphene oxide (RGO).

Another set of experiments was conducted using silver nanowires prepared by Taiwan Textile Research Institute (TTRI) and the AgNW, RGO, and AgNW-RGO hybrid films were formed using an ultrasonic spray coating process.

For comparison purposes, additional AgNW films were prepared by spin-coating AgNW dispersions on PET substrate. To prepare AgNW films on PET substrates, we treated substrates with UV/Ozone to make hydrophilic surfaces for AgNW spin-coating. Then, AgNW dispersion was spin-coated on a substrate and then dried at 120° C. for 5 min. Several AgNW films were prepared by changing spin-coating speed from 250 to 2,000 rpm to investigate the effect of spin-coating speed on optical and electrical properties of AgNW films. Transparent electrode films of AgNW-RGO and AgNW-pristine graphene hybrid were also prepared in a similar manner. Separately, the AgNW-graphene hybrid transparent electrode films were prepared by coating RGO or pristine graphene onto the AgNW film.

An UV/Vis/NIR was used to measure the optical transmittance of AgNW, AgNW-RGO, and AgNW-pristine graphene films. The sheet resistances were measured by a non-contact Rs measurement instrument. The sheet resistance and optical transparency data of thin films prepared from different materials and conditions using electro-spinning based atomization are summarized in FIGS. 3(*a*)-(*d*). The sheet resistance and optical transparency data of thin films prepared from different materials and conditions using ultrasonic spray coating based atomization are summarized in FIGS. 4(*a*)-(*c*). Several significant observations can be made from these figures:

(A) FIG. 3(*d*) indicates that the AgNW-RGO films prepared via electro-spinning based atomization route significantly out-perform the corresponding AgNW-RGO films prepared via spin-coating in terms of high transmittance and/or low sheet resistance.

(B) With 1-3 electro-spinning passes, the resulting aggregates of AgNWs exhibit a sheet resistance value of 998, 1123, 1245Ω/□, respectively, which are achieved at optical transparency higher than 90%. By spraying two passes of pristine graphene solution over these AgNW aggregates, the sheet resistance was reduced to 89, 99, and 127Ω/□, respectively. These surprisingly low resistance values were achieved even though pristine graphene films themselves with the same 2 spray passes exhibit a sheet resistance of 7.2 kΩ/□ (7,200Ω/□), as shown in FIG. 3(*c*). Clearly, there exists an unexpected synergistic effect between aerosol-deposited AgNWs and aerosol-deposited pristine graphene. These values are superior to those of un-doped CVD graphene or CVD graphene-AgNW films. These outstanding combined performances are achieved by using highly scalable, more cost-effective, less tedious, and vacuum equipment-free processes. This is most surprising.

Figure 4A:
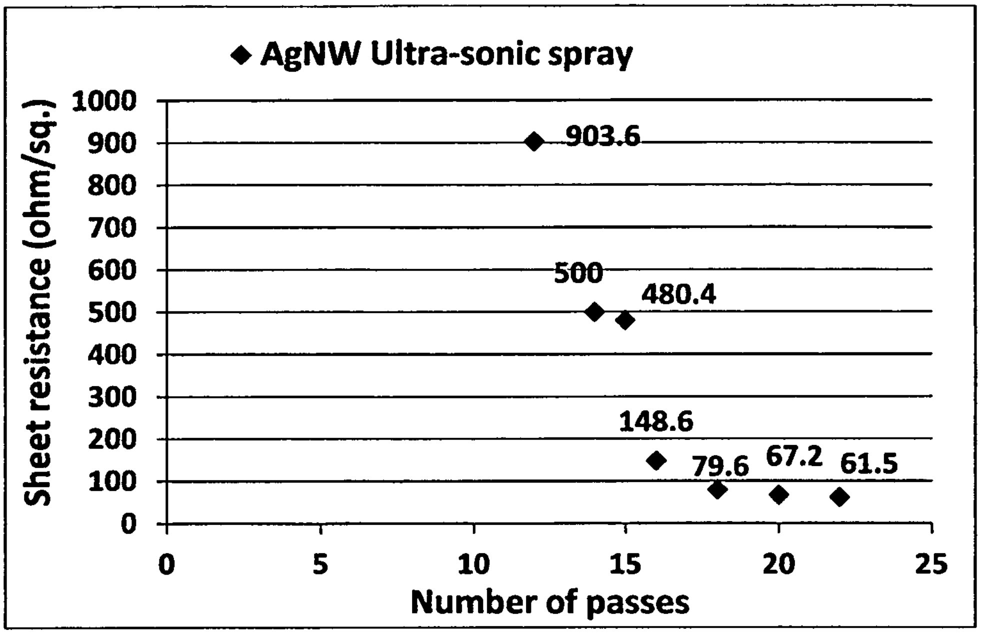
FIG. 4 (*a*) Sheet resistance of AgNW films; (*b*) optical transmittance (at 550 nm wavelength) of AgNW films; and (*c*) sheet resistance of grapheme films prepared with ultrasonic spray type atomization and deposition procedures, all plotted with the number of ultrasonic spray coating passes.
Figure 4B:
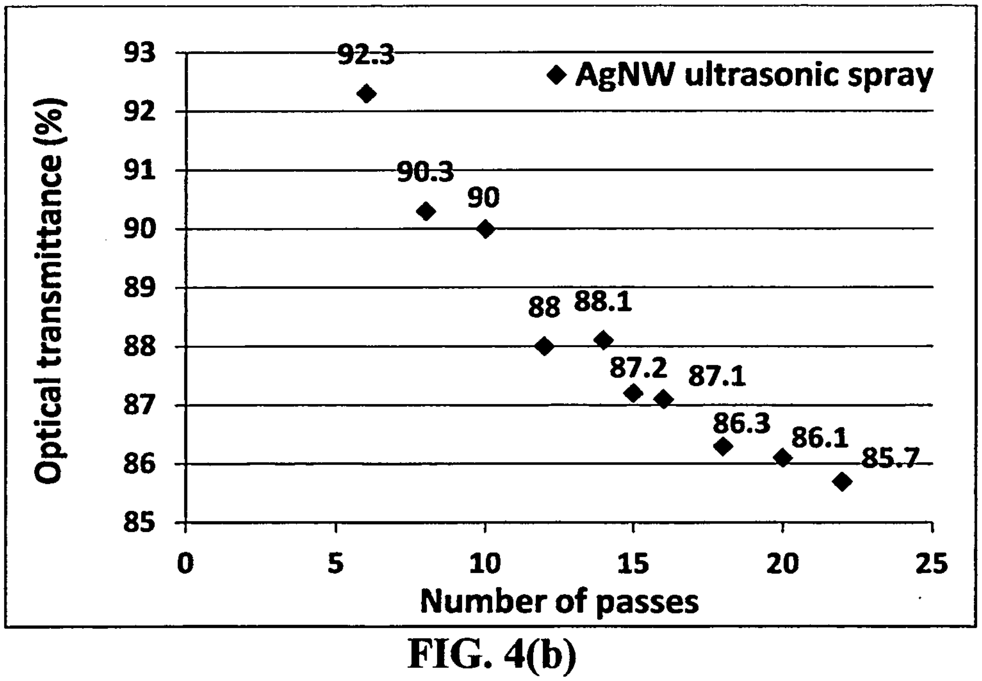
Figure 4C:
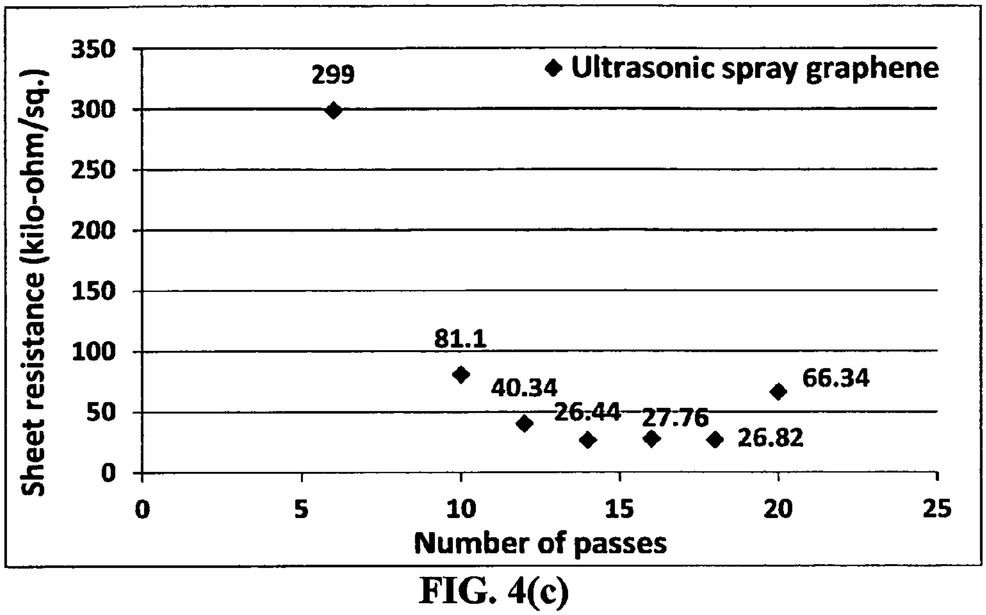

The unexpected synergistic effect of using ultrasonic spray coating to form hybrid AgNW/graphene films are also observed in FIGS. 4(*a*)-(*c*) and Table 1 below. The sheet resistance value of 67.2Ω/□ in Table 1 and also in FIG. 4(*a*) is for a film of AgNW aggregates after 20 repeated ultrasonic spray passes. Subsequently, RGO was then ultrasonic spray-coated onto this film of AgNW aggregates. With two passes of RGO spraying, the sheet resistance was decreased from 67.2Ω/□ to 42.4Ω/□, and to 37.2Ω/□ and 35.3Ω/□ after 4 and 8 passes, respectively (Table 1). This is totally unexpected since the RGO films themselves after 6-20 ultrasonic spray passes still exhibit a sheet resistance higher than 26 kΩ/□ (>26,000Ω/□), as indicated in FIG. 3(*c*).

TABLE 1

Sheet resistance values of AgNW films covered with 0-8 passes of graphene.

| No. of graphene-spraying passes after 20 AgNW-spraying passes | Sheet resistance (Ohm/sq.) | Decreased by |
|---|---|---|
| 0 | 67.2 | — |
| 2 | 42.4 | 36.80% |
| 4 | 37.2 | 44.60% |
| 8 | 35.3 | 47.50% |

(C) Sheet resistance values as low as 52-58Ω/□ (electro-spinning based aerosol droplet method) and 35.3-42.4Ω/□ (ultrasonic spray based aerosol droplet method) have been obtained, which are comparable to those of high-end ITO glass. These surprisingly low sheet resistance values were achieved at an optical transmittance higher than 86%.

Example 6

Copper Nanowire (CuNW) Film, Pristine Graphene Film, and CuNW/Pristine Graphene Film In one preferred approach, the preparation of CuNW relied upon the self-catalytic growth of Cu nanowires within a liquid-crystalline medium of hexadecylamine (HAD) and cetyltriamoninum bromide (CTAB). First, HDA and CTAB were mixed at an elevated temperature to form a liquid-crystalline medium. Upon addition of the precursor, copper acetylacetonate [Cu(acac)2], long nanowires with excellent dispersibility form spontaneously within the medium in the presence of a catalytic Pt surface.

Specifically, a solution process was followed to prepare copper nanowires (CuNWs). As an example, 8 g HAD and 0.5 g CTAB were dissolved in a glass vial at 180° C. Then, 200 mg copper acetylacetonate was added and magnetically stirred for 10 minutes. Subsequently, a silicon wafer (0.5 $cm^2$) sputtered with ~10 nm of platinum was placed into the vial. The mixtures were then maintained at 180° C. for 10 hours, resulting in the formation of reddish cotton-like sheets settled at the bottom. After rinsing with toluene for several times, the nanowires were dispersed in toluene at different solid contents. The suspensions were separately cast into thin films on glass or PET surface. Several CuNW films supported on glass or PET substrate were then deposited with either RGO film or pristine graphene film using aerosol droplet methods (electro-spinning and ultrasonic spray coating) and conventional spin-coating.

Figure 5A:
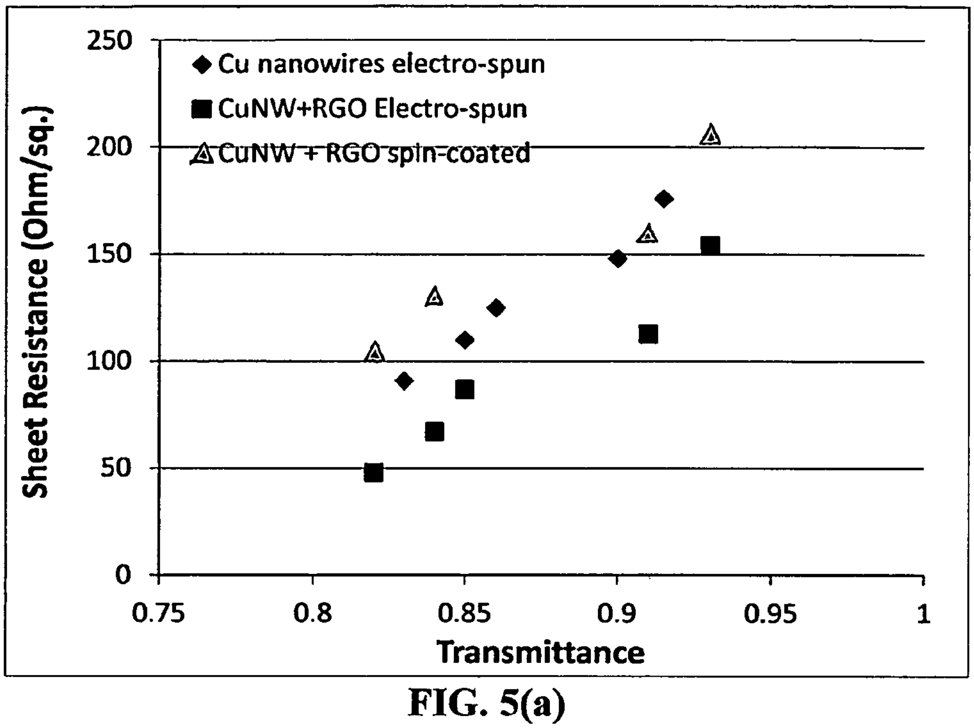
FIG. 5 (*a*) Sheet resistance vs. transmittance of CuNW, spin-coated CuNW-RGO, and electro-spinning aerosol-deposited CuNW-RGO; (*b*) Sheet resistance vs. transmittance of CuNW, spin-coated CuNW-RGO, and ultrasonic spray-coated CuNW-RGO films.
Figure 5B:
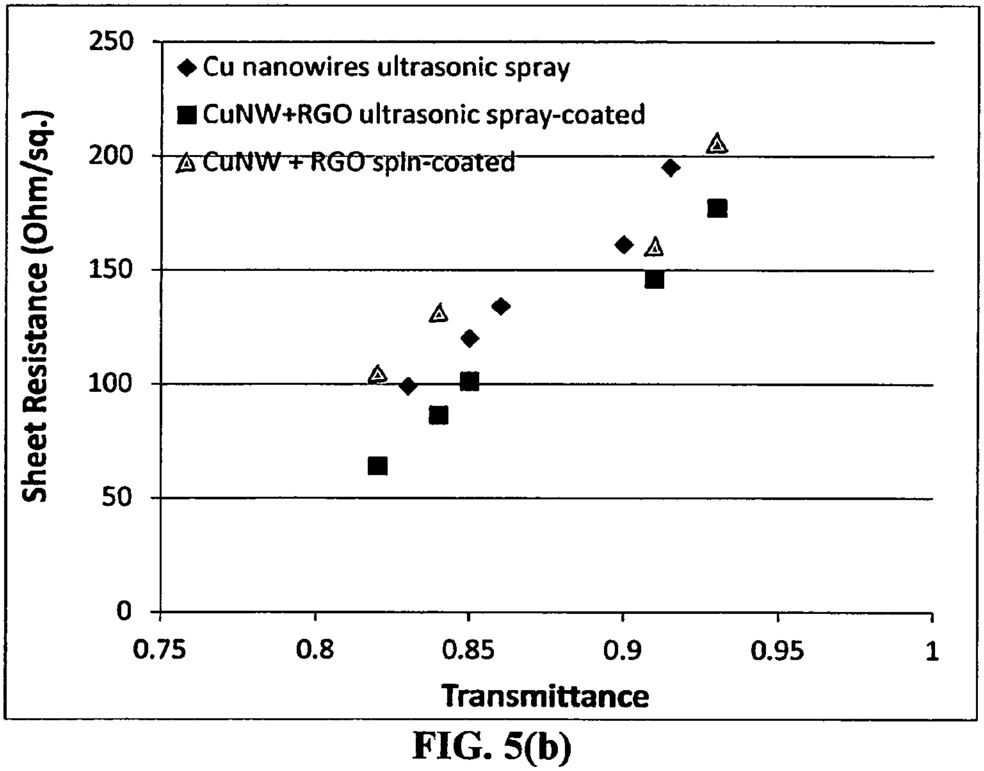

The sheet resistance and optical transparency data of these films are summarized in FIGS. 5(*a*) and 5(*b*). Several significant observations can be made by examining the data from this chart: (A) The CuNW-RGO films prepared via electrospinning based aerosol droplets significantly out-perform the corresponding CuNW-RGO films prepared via conventional spin-coating in terms of high transmittance and/or low sheet resistance. (B) With aerosol-deposited hybrid CuNW-RGO films, we were able to achieve a sheet resistance value of 154 and 113Ω/□ at 93% and 91% transmittance, respectively. These values are superior to those of all CuNW-based electrodes ever reported. These outstanding combined performances are achieved by using highly scalable, more cost-effective, less tedious, and vacuum equipment-free processes. (C) Sheet resistance values as low as 67 and 48Ω/□ have been obtained, which are comparable to those of ITO glass. These surprisingly low sheet resistance values were achieved at an optical transmittance of 82% and 84%, respectively. These are most impressive and surprising considering the fact that the electrical conductivity of Cu is an order of magnitude lower than that of silver and, hence, one would not have expected such a low sheet resistance associated with CuNW even when in combination with graphene, which is even lower than Cu in electrical conductivity.

Example 7

CNT Film, Pristine Graphene Film, RGO and CNT/Graphene Films

CNTs, pristine graphene, RGO, and their hybrid films were prepared using both spin-coating and ultrasonic spray coating. As an example, 5 mg of arc-discharged P3SWCNT (Carbon Solutions, Inc.) and 1 mg of graphene oxide were dispersed into a solution of 98% hydrazine (Sigma Aldrich) and allowed to stir for one day. All materials were used as received. Subsequent to stirring, the stable dispersion was centrifuged to separate out any CNT bundles and aggregated RGO particles. After centrifugation, uniformity of the dispersion was further ensured by heating to 60° C. with repeated ultrasonic agitation for 30 min. The resulting colloid was used in spin-coating and ultrasonic spray coating.

For use as substrates, glass and PET films were cleaned in a combination of reagent grade acetone and isopropyl alcohol solution and pre-treated for 5 minutes by oxygen plasma in order to ensure good wetting by hydrazine. After deposition, the films were heated to 115° C. to remove residual hydrazine. The sheet resistance and transmittance data of various transparent conductive films are shown in Table 2 below. The RGO sheets used in the present study are single-layer or few layer graphene. These data indicate that thin films with combined RGO-CNTs prepared via ultrasonic spraying significantly out-perform combined RGO-CNT films prepared via spin-coating. The longstanding problem of high sheet resistance associated with CNT films, RGO films, and combined RGO-CNT films having a transmittance no less than 90% (an industry requirement) is now overcome.

TABLE 1

Sheet resistance and transmittance data of various transparent conductive films.

| 1st set of samples (RGO) | CNT film | RGO | CNT/RGO spin-coated | CNT/RGO ultrasonic spray-coated |
|---|---|---|---|---|
| Sheet resistance | 21 kΩ/□ | 475 kΩ/□ | 620 Ω/□ | 280 Ω/□ |
| Transmittance | 90% | 94% | 90% | 92% |
| **2nd set of samples (Pristine graphene, PG)** | CNT/PG, spin-coated | Pristine graphene (PG) | CNT/PG, ultrasonic spray | |
| Sheet resistance | 225 Ω/□ | 260 Ω/□ | 102 Ω/□ | |
| Transmittance | 92% | 95% | 92% | |

In summary, a novel and unique class of transparent and conductive electrodes has been developed. This new class of hybrid materials surprisingly offers the following special features and advantages:

(a) Thin films containing networks of metal NWs or carbon nanotubes combined with graphene sheets prepared through aerosol droplet formation and deposition are a promising replacement to ITO glass due to their exceptionally high conductivity (low resistance) and optical transmittance.

(b) Even though Cu has a much lower electrical conductivity as compared with silver, the CuNW-graphene electrodes prepared with aerosol methods still surprisingly provide excellent combination of high optical transparency and low sheet resistance.

(c) Even though CNTs have a much lower electrical conductivity as compared with copper and silver, the CNT-pristine graphene electrodes prepared with aerosol methods (e.g. ultrasonic spray coating) still surprisingly provide excellent combination of high optical transparency and low sheet resistance suitable for a wide variety of electro-optical device applications.

(d) Pristine graphene (single-grain, oxygen-free, and hydrogen-free), if deposited into a thin film using ultrasonic spray coating or other type of aerosol droplet process, is significantly more effective than reduced graphene oxide and CVD graphene in terms of imparting electrical conductance to the metal nanowire or carbon nanotube films without compromising the optical transmittance. This has been quite unexpected.

(e) The presently invented pristine graphene-AgNW films are particularly useful for organic optoelectronic devices such as organic photovoltaic (OPV) cells, organic light-emitting diodes, and organic photo-detectors because they can be deposited on flexible, light-weight substrates using low-cost fabrication methods.

(f) An important aspect of optoelectronic thin-film devices is the transparent, conductive electrode through which light couples in or out of the devices. Indium tin oxide (ITO) is widely used but may be too expensive for an application such as solar cells. Moreover, metal oxides such as ITO are brittle and therefore of limited use on flexible substrates. The present invention provides a substitute for ITO with a similar sheet resistance and transparency performance, but at a lower cost, higher flexibility, durability, and integrity.

We claim:

1. A method of producing an optically transparent and electrically conductive film, said method comprising (a) forming aerosol droplets of a first dispersion comprising first conducting nano filaments in a first liquid wherein said nano filaments have a dimension less than 200 nm; (b) forming aerosol droplets of a second dispersion or solution comprising a graphene material in a second liquid; (c) depositing said aerosol droplets of a first dispersion and said aerosol droplets of a second dispersion or solution onto a supporting substrate; and (d) removing the first liquid and the second liquid from the droplets to form said optically transparent and electrically conductive film, which consists of said first conducting nano filaments and said graphene material having a nano filament-to-graphene weight ratio of from 1/99 to 99/1, wherein said film exhibits an optical transparence no less than 80% and sheet resistance no higher than 300 ohm/square.

2. The method of claim 1, wherein said first conducting nano filaments are selected from metal nanowires, metal nano-rods, metal nanotubes, metal oxide filaments, metal-coated filaments, conducting polymer fibers, carbon nano-fibers, carbon nanotubes, carbon nano-rods, or a combination thereof.

3. The method of claim 2, wherein said metal nanowires are selected from nanowires of silver (Ag), gold (Au), copper (Cu), platinum (Pt), zinc (Zn), cadmium (Cd), cobalt (Co), molybdenum (Mo), aluminum (Al), an alloy thereof, or a combination thereof.

4. The method of claim 2, wherein said metal nanowires contain silver nanowires.

5. The method of claim 2, wherein said metal nanowires contain copper nanowires.

6. The method of claim 2, wherein said metal nanowires are selected from nanowires of a transition metal or an alloy of a transition metal.

7. The method of claim 1, wherein said graphene material is selected from a single-layer or few-layer variant of pristine graphene, graphene oxide, reduced graphene oxide, hydrogenated graphene, nitrogenated graphene, doped graphene, chemically functionalized graphene, or a combination thereof, wherein said few-layer is defined as having less than 10 planes of hexagonal carbon atoms.

8. The method of claim 1, wherein said graphene material is selected from a single-layer or few-layer pristine graphene having 1 to 5 planes of hexagonal carbon atoms.

9. The method of claim 1, wherein said step (a) of forming aerosol droplets of a first dispersion or said step (b) of forming aerosol droplets of a second dispersion or solution is conducted through syringe-based atomization, compressed air-driven atomization, electrostatically-driven atomization, electro-spinning atomization, or a combination thereof.

10. The method of claim 1, wherein said step (c) contains depositing said aerosol droplets of a first dispersion and depositing said aerosol droplets of a second dispersion or solution in a sequential or concurrent manner.

11. The method of claim 1, wherein said step (c) contains depositing said aerosol droplets of a first dispersion onto said supporting substrate to form an aggregate of said first nano filaments prior to depositing said aerosol droplets of a second dispersion or solution to from a graphene film covering said aggregate.

12. The method of claim 1, wherein said step (a) of forming said aerosol droplets of a first dispersion and said step (b) of forming said aerosol droplets of a second dispersion or solution are conducted in one step.

13. The method of claim 1, wherein said step (a) and said step (b) contain dispersing said first conducting filaments and said graphene material in said first liquid, said second liquid, or a mixture of said first liquid and said second liquid to form a hybrid dispersion, which is aerosolized to form a mixture of aerosol droplets of said first dispersion and aerosol droplets of said second dispersion.

14. The method of claim 1, wherein said step (c) contains intermittently or continuously feeding said supporting substrate from a feeder roller into a deposition zone where said aerosol droplets of a first dispersion and aerosol droplets of a second dispersion or solution are deposited onto said supporting substrate to form a transparent conductive film-coated substrate, and the method further contains a step of collecting said coated substrate on a collector roller.

15. The method of claim 1, wherein said aerosol droplets of a first dispersion or aerosol droplets of a second dispersion or solution are propelled to deposit onto said supporting substrate at an impingement speed of at least 1.0 cm/s.

16. The method of claim 1, wherein said aerosol droplets of a first dispersion or aerosol droplets of a second dispersion or solution are propelled to deposit onto said supporting substrate at an impingement speed of at least 10 cm/s.

17. The method of claim 1, wherein said optically transparent and electrically conductive film exhibits an optical transparence no less than 85% and sheet resistance no higher than 100 ohm/square.

18. The method of claim 1, wherein said optically transparent and electrically conductive film exhibits an optical transparence no less than 85% and sheet resistance no higher than 50 ohm/square.

19. The method of claim 1, wherein said optically transparent and electrically conductive film exhibits an optical transparence no less than 90% and sheet resistance no higher than 200 ohm/square.

20. The method of claim 1, wherein said optically transparent and electrically conductive film exhibits an optical transparence no less than 90% and sheet resistance no higher than 100 ohm/square.

21. The method of claim 1, wherein said optically transparent and electrically conductive film exhibits an optical transparence no less than 92% and sheet resistance no higher than 100 ohm/square.

22. The method of claim 1, wherein said supporting substrate is optically transparent.

23. The method of claim 1, wherein said supporting substrate is moved from a feeder roller to a collector roller and the method contains a roll-to-roll procedure.

* * * * *